(12) United States Patent
Suzuki et al.

(10) Patent No.: US 7,579,290 B2
(45) Date of Patent: Aug. 25, 2009

(54) FUNCTIONAL FIBER SHEET

(75) Inventors: Masayuki Suzuki, Aichi (JP); Eigo Nakashima, Aichi (JP); Toshikazu Suzuki, Aichi (JP); Takahiro Suzuki, Aichi (JP)

(73) Assignee: Kabushiki Kaisha Suzutora, Gamagori-Shi (JP)

( * ) Notice: Subject to any disclaimer, the term of this patent is extended or adjusted under 35 U.S.C. 154(b) by 1 day.

(21) Appl. No.: 10/512,107

(22) PCT Filed: Apr. 25, 2003

(86) PCT No.: PCT/IB03/01555

§ 371 (c)(1),
(2), (4) Date: Oct. 21, 2004

(87) PCT Pub. No.: WO03/091472

PCT Pub. Date: Nov. 6, 2003

(65) Prior Publication Data

US 2005/0221707 A1    Oct. 6, 2005

(30) Foreign Application Priority Data

Apr. 25, 2002   (JP) ............................. 2002-123295

(51) Int. Cl.
*B32B 27/02* (2006.01)
*B32B 15/14* (2006.01)

(52) U.S. Cl. ...................... 442/164; 442/228; 442/229; 442/230; 442/231; 442/304; 442/307; 442/316; 442/317

(58) Field of Classification Search ................ 428/413, 428/433, 334, 414, 164, 228, 229, 230, 231, 428/304, 307, 316, 317
See application file for complete search history.

(56) References Cited

U.S. PATENT DOCUMENTS

| 4,422,917 | A | * | 12/1983 | Hayfield | ............... 204/196.01 |
| 6,074,981 | A | * | 6/2000 | Tada et al. | ................... 502/224 |
| 6,143,405 | A | * | 11/2000 | Palmgren | .................... 428/328 |
| 6,296,895 | B1 | | 10/2001 | Steiniger et al. | |
| 6,322,875 | B1 | | 11/2001 | Kimura | |

FOREIGN PATENT DOCUMENTS

| EP | 0886 290 A1 | 12/1998 |
| JP | 5338073 | 12/1993 |
| JP | 10323933 | 12/1998 |
| JP | 2001-17301 | 1/2001 |
| JP | 2001253007 | 9/2001 |

\* cited by examiner

*Primary Examiner*—Ula C Ruddock
(74) *Attorney, Agent, or Firm*—Day Pitney LLP

(57) ABSTRACT

A functional sheet is coated with physically vapor-deposited film including titanium oxide and other metallic oxides for making the film transparent so color and pattern on the fiber sheet are visible, providing electric conductivity to the film, improving the productivity of vapor deposition and enabling selective blocking of infrared and ultraviolet radiation.

5 Claims, 3 Drawing Sheets

TS = Test Sample

TS = Test Sample

FUNCTIONAL FIBER SHEET

TECHNICAL FIELD OF THE INVENTION

This invention relates to functional fiber sheet coated with physically vapor-deposited film comprising titanium oxide and other metallic oxides.

RELATED ART

It is known that by forming metallic or metallic oxide thin film on the surface of fiber sheet comprising synthetic fiber such as woven goods, knit goods, nonwoven fabric, through the use of physical vapor deposition methods such as vacuum vapor deposition, ion beam method, sputtering method, etc., various types of functions can be conferred on the fiber sheet such as electric conductivity, heat-shielding, heat retention, dirt repellency, anti-bacterial properties, deodorizing properties, and the like. However, when the fiber sheet surface is coated with a vapor-deposited film of metal, for example, stainless, titanium, chromium, or copper and the like, color, pattern, etc. on the fiber sheet are hidden by the vapor-deposited film and present a metallic color, lack of variety from a fashion standpoint was a problem. On the one hand, when vapor-deposited film comprising metallic oxides such as titanium oxide, etc. is formed, because said oxides comprise ordinary oxide containing oxygen in the minus two valence state, it was possible to enable color and pattern and the like to become visible by adjusting film thickness so that vapor-deposited film was transparent; on the other hand, there were problems in that electric conductivity was poor in comparison to metallic vapor-deposited film; heat-shielding properties were inferior as well, moreover, productivity decreased.

Further, formation of vapor-deposited film is known, having multilayer structure comprising $TiO_2$, Ag and $TiO_2$ as the three layers, vapor-deposited film increasing visible light transmittance while selectively blocking ultraviolet and infrared radiation; however, because this vapor-deposited film peels readily upon repeated washing, it was not practical, moreover, there were problems in that metal oxidized on use, properties deteriorated.

This invention, in functional fiber sheet obtained by coating fiber sheet with physically vapor-deposited film, by changing the composition of this physically vapor-deposited film, made the vapor-deposited film transparent so color and pattern on the fiber sheet became visible, furthermore, was able to provide functionality to the vapor-deposited film such as electric conductivity, infrared radiation blocking, ultraviolet radiation blocking, and the like, moreover, made productivity increase possible at the time of vapor-deposition.

SUMMARY OF THE INVENTION

Fiber sheet relating to this invention, in functional fiber sheet comprising fiber sheet comprising synthetic fiber, one face or both faces thereof being coated with physically vapor-deposited film comprising metallic oxides, aforementioned metallic oxides characterized as comprising a mixture of ordinary oxides as a main component, containing a small amount of oxides having a lower valence than the ordinary oxides.

Synthetic fibers used in this invention comprise thermoplastic synthetic fibers used in usual knit and woven use, exemplified by polyester fiber, nylon fiber, acrylic fiber and polyimide fiber and the like. In particular, polyester fiber is preferred from the standpoint of low moisture content, ease in physical vapor deposition of metals and metallic oxides, and superior durability of the vapor-deposited film. This synthetic fiber can be in either staple or filament form; staple or filament is used without modification in the manufacture of nonwoven fabric, but when used as structural yarn for woven goods or knit goods, filament yarn such as monofilament yarn and multifilament yarn is preferred.

In this invention, thin film comprising metallic oxides such as titanium oxide is formed on one face or both faces of aforementioned fiber sheet, by physical vapor deposition methods such as vacuum vapor deposition, ion beam method, sputtering method, etc., preferred method is sputtering. Aforementioned metallic oxides comprise ordinary oxide containing oxygen in the −2 valence state as principal substance, a small amount of oxides having lower valence than the ordinary oxides as a secondary component, hereinafter termed lower oxides is mixed therein. For example, in the oxides of titanium, tetravalent oxide $TiO_2$ is known as the ordinary oxide, as lower oxides, divalent oxide TiO and trivalent oxide $Ti_2O_3$ are known. Consequently, the vapor-deposited film of titanium oxide is formed by a mixture of the aforementioned ordinary valence oxides (tetravalent oxides) and lower valence oxides (divalent or trivalent oxides).

In physical vapor deposition such as sputtering and the like, while metal is sputter-vaporized in a sealed chamber containing a slight amount of argon gas, it is oxidized by a small amount of oxygen supplied to the chamber, and adsorbed on the fiber sheet, but when the amount of oxygen supplied reaches the amount adequate for production of ordinary oxide, only the ordinary oxide is produced, concurrently, surface of the target metal is oxidized to effect large reduction in the amount of vaporized metal, productivity drops.

In contrast to this, when the amount of oxygen supplied is an amount less than that needed for production of ordinary oxides, aforementioned lower oxides are also produced concurrently with ordinary oxide, these are adsorbed in the form of mixture on the fiber sheet, moreover, because the target surface is not oxidized, amount of vaporized metal does not decrease, drop in productivity is prevented. Consequently, by forming vapor-deposited film comprising the aforementioned mixture, moreover, by adjusting the thickness of the vapor-deposited film, it becomes possible to provide electric conductivity, heat-shielding, and other functions to the vapor-deposited film while transparency is maintained. Furthermore, in the aforementioned sputtering situation, productivity is improved to an even higher level by admixing a slight amount of nitrogen gas together with argon gas and oxygen.

In order to set the amount of oxygen supplied at an amount less than that needed for production of ordinary oxide, it is advantageous to determine the unique brightness of light emitted by vaporized metal when the vaporized metal passes through the plasma generated at the time of sputtering, for example, the luminance, and adjust the amount of oxygen supplied so this luminance is maintained at a constant level. For example, in the case where the metal is titanium, when titanium passes through plasma upon sputter vaporization, visible light at wavelength 453 nm is emitted, in the absence of oxygen, the vaporization speed attains a maximum, the brightness is strongest; when excess oxygen is supplied, vaporization speed attains a minimum, brightness decreases as well. Consequently, by adjusting the amount of oxygen supplied on the basis of luminance, it becomes possible to control the amount of lower oxide. Further, it is possible to use any desired intensity index correlated to luminance, instead of luminance itself.

Mixture content of oxides having valence lower than that of aforementioned ordinary oxide, in other words, lower oxide, is preferably 0.1~20 wt % of the total oxides; when this mixture content is less than 0.1 wt %, functions such as electric conductivity and heat-shielding are not obtained, moreover, productivity is drastically decreased; in contrast, at more than 20 wt %, metallic color is evident, moreover, visible light transmittance is insufficient, fiber sheet attributes are lost. Further, thickness of the aforementioned physically vapor-deposited film is preferably 5~500 nm, in particular, 30~300 nm; at less than 5 nm, functions such as electric conductivity, heat-shielding, infrared radiation cuts, ultraviolet radiation cuts, etc. are not obtained, at greater than 500 nm, structural fibers, color, pattern, etc. of the fiber sheet are not visible, there are difficulties in attaining practical use from a cost standpoint as well.

Further, transparency of the aforementioned physically vapor-deposited film is preferably 30% or more for visible light transmittance at wavelength 550 nm, at less than 30%, color and pattern on the surface of the fiber sheet [and] fibers are no longer visible, fiber sheet attributes are lost. Further, transmittance of infrared radiation and ultraviolet radiation is fixed by the mixture content of the lower valence oxides, but when infrared radiation cuts comprise the objective, it is preferable to set the mixture content on the high side and suppress the infrared radiation transmittance to 70% or less at wavelength 1000 nm. Further, when ultraviolet radiation cuts comprise the objective, it is preferable to set the aforementioned mixture content on the low side and suppress the ultraviolet radiation transmittance to 50% or less at wavelength 400 nm.

DETAILED DESCRIPTION OF THE INVENTION

EXAMPLES OF THE INVENTION

Example 1

As fiber sheet, woven fabric using polyester fiber multifilament yarn as warp and weft is used, transparent coating of titanium oxide is formed on its surface by sputtering, having thickness of 5~500 nm, preferably 30~300 nm.

Figure 1:
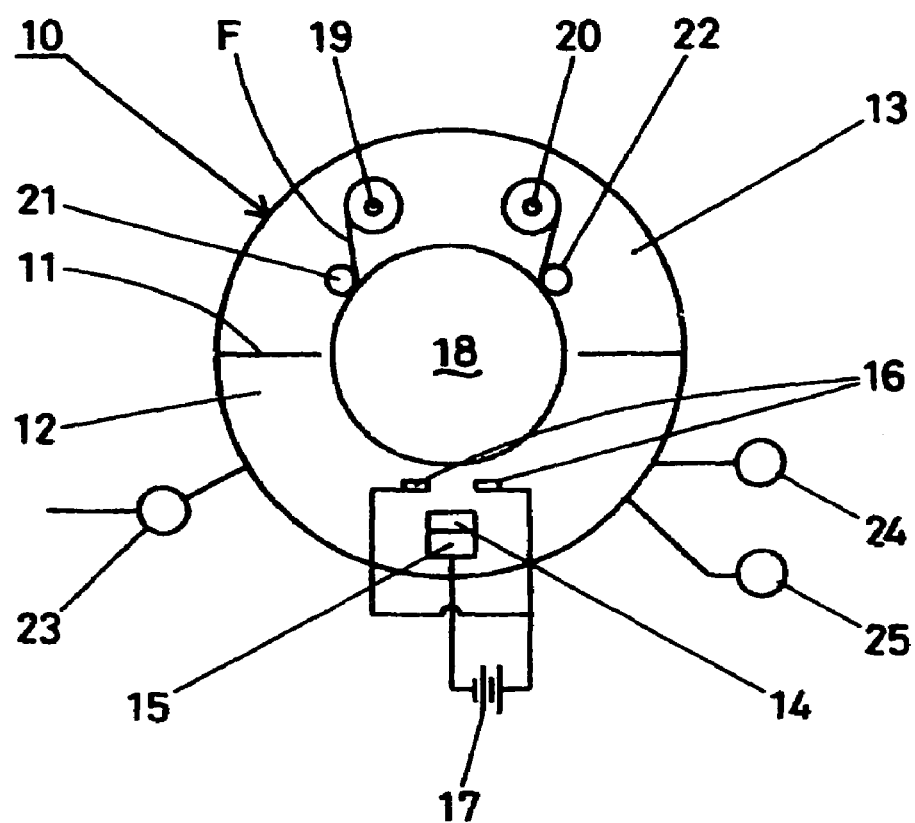
FIG. 1 is a cross-sectional diagram of sputtering device related to Working Example 1.

FIG. 1 shows one example of a sputtering device, sealable chamber 10 is divided by horizontal divider 11 into sputtering chamber 12 below and fabric chamber 13 above, in the middle of sputtering chamber 12 below, flat plate target 14 comprising titanium is fixed on target source 15 located in mid-air, target 14 is cooled from its bottom face by cold water passing through this target source 15. Anode 16 is affixed horizontally at the left and right above this target 14, direct current voltage of 200~1000 V is impressed by means of direct current power source 17 between this anode 16 and target 14.

Water-cooled cylinder 18 is affixed horizontally above aforementioned anode 13, and moreover, rotates freely, above this to the left, fiber sheet sending shaft 19, further, above and to the right, fiber sheet F winding shaft 20 are respectively horizontally affixed, moreover, these rotate freely. Thus, pre-process fiber sheet F wrapped around sending shaft 19 is pulled out, wrapped around aforementioned water-cooled cylinder 18 through guide roller 21 at upper left, and wound on winding shaft 20 through guide roller 22 at upper right. Further, vacuum pump 23, argon gas supply gas bomb 24, and oxygen gas supply gas bomb 25 are respectively connected to aforementioned chamber 10.

In the aforementioned device, sending shaft 19, winding shaft 20, and water-cooled cylinder 18 are rotated, fabric F is sent at a fixed speed in counterclockwise direction while being cooled on water-cooled cylinder 14, surface temperature of fabric F is maintained at 60° C. or lower. On the other hand, vacuum pump 23 is driven to reduce internal pressure in chamber 10 to about $1.3 \times 10^{-3}$ Pa, next, argon gas from argon gas supply gas bomb 24 and oxygen from oxygen gas supply gas bomb 25 are respectively introduced to adjust the internal pressure of chamber 10 to about $1 \times 10^{-2}$ Pa, sputtering is implemented thereafter, titanium emitted from target 14 is reacted with oxygen to form titanium oxide, this is allowed to adhere on aforementioned fiber sheet F, transparent physically vapor-deposited film is formed.

At this time, sputtering is implemented while brightness of vaporized titanium passing through plasma above target 14 is observed; during this time, by adjusting the amount of oxygen sent from oxygen gas supply gas bomb 25 to chamber 10, the luminance of aforementioned vaporized titanium or any desired intensity index correlated to luminance is controlled at a fixed level determined by tests beforehand; by this means titanium oxide comprises [a mixture of] ordinary oxides and lower oxides, the mixture is formed wherein the amount of lower oxide to the total amount of metallic oxides is 0.1~20 wt %, to be adsorbed on fiber sheet F. Further, traveling speed of fiber sheet F is adjusted so that physically vapor-deposited film comprising aforementioned titanium oxide has thickness of 5~500 nm.

In the aforementioned Working Example, as the amount of oxygen supplied to chamber 10 is set higher, further, as the setting for luminance is set lower, there is increase in ordinary oxide and decrease in lower oxide, transparency of the physically vapor-deposited film increases. On the other hand, as the amount of oxygen supplied is set lower, further, as the setting for luminance (intensity) is set higher, there is decrease in ordinary oxide and increase in lower oxide, transparency of the physically vapor-deposited film decreases, metallic color becomes stronger. Furthermore, by the aforementioned adjustment of luminance, it becomes possible to maintain visible light transmittance at 20% or more, while infrared radiation transmittance or ultraviolet radiation transmittance is suppressed at 70% or less.

By using warp-knit fabric comprising polyester fiber multifilament yarn as the aforementioned fiber sheet, and other than that, implementing sputtering just as described above, fiber sheet was obtained that had electric conductivity and heat-shielding properties, moreover, was provided with the attributes of warp-knit fabric, had visible light transmittance of 30% or more, infrared radiation transmittance or ultraviolet radiation transmittance of 70% or less.

Further, by using spun-bonded nonwoven fabric comprising polyester filament as the afore-mentioned fiber sheet, and other than that, implementing sputtering just as described above, fiber sheet was obtained that had electric conductivity and heat-shielding properties, moreover, was provided with the attributes of spun-bonded nonwoven fabric, had visible light transmittance of 30% or more, infrared radiation transmittance or ultraviolet radiation transmittance of 70% or less.

Example 2

By using sputtering device in FIG. 1, implementing sputtering on one face of fiber sheet comprising woven goods, knit goods or nonwoven fabric, etc., to form aforementioned physically vapor-deposited film, thereafter removing aforementioned fiber sheet temporarily, thereafter reversing the front and back and reattaching to the sputtering device, thereafter implementing sputtering on the other face identically as aforementioned, fiber sheet is obtained, having aforementioned physically vapor-deposited film on both front and back faces, having visible light transmittance of 30% or more, infrared radiation transmittance or ultraviolet radiation transmittance of 70% or less, moreover, being provided with attributes of fiber sheet, color and pattern being visible thereon, having no metallic color.

Example 3

In the aforementioned sealed chamber, 2 sets of vapor deposition devices are set up in rows, sputtering is implemented continuously on both front and back faces to form the aforementioned physically vapor-deposited film. For example, No. 1 water-cooled cylinder and No. 2 water-cooled cylinder are set up in parallel to the left and right of center in the sealed chamber, No. 1 water-cooled cylinder on the left is rotated in counterclockwise direction, No. 2 water-cooled cylinder on the right is rotated in clockwise direction, respectively; sputtering is implemented by wrapping fiber sheet from the left so that its back face comes in contact with the lower half of No. 1 water-cooled cylinder, next, [sheet is] led to top right of No. 2 water-cooled cylinder, sputtering is implemented by wrapping fiber sheet from the right so that its front face comes in contact with the lower half of this No. 2 water-cooled cylinder.

As fiber sheet F in Working Example 1, 190-count taffeta using polyester multifilament yarn in warp and weft was used, transparent physically vapor-deposited film of titanium oxide was formed on one face thereof by sputtering. As oxygen supply control, "Dual Magnetron Cathode Plasma Emission Monitor" ("von Alden", Germany) was used; monochromatic light (wavelength 453 nm) unique to metallic titanium was taken out with collimator to determine luminance, aforementioned luminance was expressed as intensity, where luminance at zero oxygen supply was 100, luminance at excess oxygen supply was 10; Test Sample A was obtained when this intensity was set at 50. Also, Test Sample B was obtained when intensity was set at 30.

The compositions of physically vapor-deposited film for Test Sample A and Test Sample B were analyzed by X-ray photoelectron spectrophotometry. As the analytical device, SSX-100 Model X-ray Photoelectron Spectrophotometer (SSI Co.) was used. Upon analysis by using monochromatic AlKα (100 W) as the x-ray source, in Test Sample A at intensity 50, about 5% trivalent lower oxide $Ti_2O_3$ was also present in tetravalent ordinary oxide. Further, in Test Sample B at intensity 30, this vapor-deposited film was formed almost completely with tetravalent ordinary oxide $TiO_2$. Ratio of titanium and oxygen in the vapor-deposited film was 1/2.15 in Test Sample A, 1/2.39 in Test Sample B. Further, external appearances were compared for the aforementioned Test Sample A and B, the results, together with the aforementioned analytical results are shown in Table 1 below.

TABLE 1

| | Test Sample A | Test Sample B |
|---|---|---|
| Intensity | 50 | 30 |
| Thickness of vapor-deposited film (μm) | 50 | 50 |

TABLE 1-continued

| | Test Sample A | Test Sample B |
|---|---|---|
| External appearance | Colorless transparent | Colorless transparent |
| Titanium/oxygen (atom ratio) | 1/2.15 | 1/2.39 |
| Low valence oxide content | 5% | 0% |

Vapor-deposited film of aforementioned titanium oxide was formed on transparent film having thickness of 50 μm, comprising polyethylene terephthalate, to measure the electric conductivity and light transmittance of the aforementioned vapor-deposited film. At this time, Test Samples 1~6 were prepared by changing intensity in 6 steps, 70, 60, 50, 40, 30, 20. Then electric conductivity, light transmittance at wavelength 400~1000 nm and light reflectivity were respectively measured for these Test Samples 1~6. Electric conductivity is shown in Table 2, light transmittance in FIG. 2, light reflectivity in FIG. 3, respectively.

TABLE 2

| | Test Sample No. | | | | | |
|---|---|---|---|---|---|---|
| | 1 | 2 | 3 | 4 | 5 | 6 |
| Intensity | 70 | 60 | 50 | 40 | 30 | 20 |
| Electric conductivity (Ω/cm) | $8 \times 10^3$ | $1 \times 10^4$ | $7 \times 10^4$ | $4 \times 10^7$ | — | — |

As shown in aforementioned Table 2, when electric conductivity is compared in terms of resistance values, Test Sample 1 having intensity 70, containing the most lower oxide, has the lowest resistance value; as the amount of lower oxide decreases, resistance values decrease in the order of Test Sample 2 having intensity 60, Test Sample 3 having intensity 50, Test Sample 4 having intensity 40; resistance values could not be measured for Test Sample 5 having intensity 30 and Test Sample 6 having intensity 20, electric conductivity was essentially zero.

Figure 2:
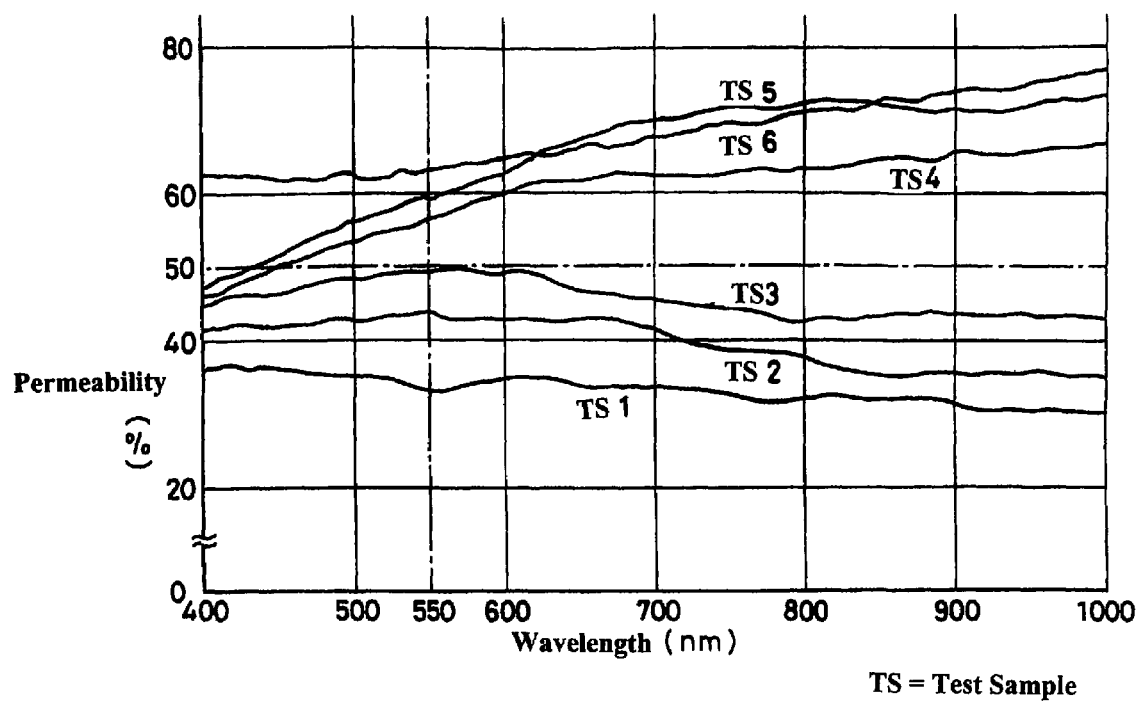
FIG. 2 is a graph showing light transmittance of vapor-deposited film.

Further, in light transmittance, as shown in FIG. 2, Test Sample 4~6 having low intensity had high transmittance, transparency increased, in contrast, in Test Sample 1~3 having high intensity, transmittance decreased, there was a tendency for external appearance to present a metallic color. Further, in Test Sample 6 having intensity 20, transmittance was 60% or more in the entire range including ultraviolet radiation to infrared radiation, from wavelength 400 mm to 1000 nm. In Test Sample 5 having intensity 30, ultraviolet radiation transmittance at wavelength 400 nm was less than 50%, but for the remaining visible light and infrared radiation, transmittance was 50~70%. In Test Sample 4 having intensity 40, infrared radiation transmittance was lower than 70%, although tendency somewhat similar to Test Sample 3 was displayed.

Further, in Test Sample 3 having intensity 50, visible light transmittance at wavelength 550 nm was about 50%, for ultraviolet radiation at wavelength 400 nm, about 45%, for infrared radiation at wavelength 1000 nm, about 43%. Further, in Test Sample 2 having intensity 60, about equal transmittance was observed in the range of 40~45% from ultraviolet radiation at wavelength 400 nm to visible light at wavelength 700 nm; transmittance gradually decreased beyond 700 nm, and was about 35% at infrared radiation wavelength 1000 nm. Further, in Test Sample 1 having intensity 70, transmittance decreases gradually from about 37% to 30%, from ultraviolet radiation at wavelength 400 to infrared radiation at wavelength 1000 nm, Furthermore, light transmittance of the aforementioned film itself was about 85% at wavelength 400 nm, about 88% at wavelength 550 nm, about 89% at wavelength 1000 nm; there was a very slight upward trend to the right.

Figure 3:
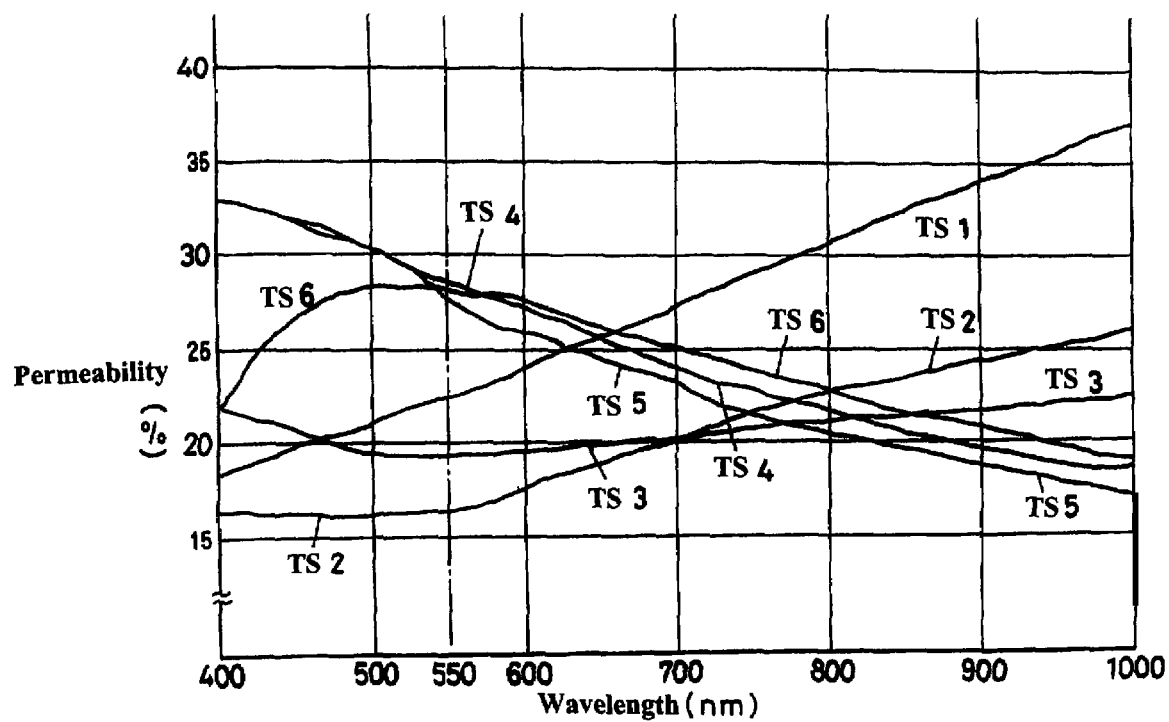
FIG. 3 is a graph showing light reflectivity of vapor-deposited film.

On the other hand, light reflectivity, as shown in FIG. 3, had a somewhat downward slope to the right in Test Sample 4~6 having low intensity, in Test Sample 1~3 having high intensity, a tendency toward a somewhat upward slope to the right was observed. However, Test Sample 6 having intensity 20 showed the highest reflectivity of about 28% at wavelength 500~600 nm in the visible light range, there was a sudden drop on the ultraviolet radiation side, a gradual decrease on the infrared radiation side, the curve had a mountain shape. Also, in Test Sample 5 having intensity 30 and Test Sample 4 having intensity 40, the downward slopes to the right were more or less similar, reflectivity at wavelength 400 nm was about 33%, reflectivity at wavelength 1000 nm was 17~19%.

Further, Test Sample 3 having intensity 50 showed the lowest reflectivity of about 19% at wavelength 500~600 [nm] in the visible light range, there was a gradual increase toward wavelength 400 nm and 1000 nm to about 22~23%. Further, Test Sample 2 having intensity 60 showed more or less uniform reflectivity of 16~17% at wavelength 550 nm or less, there was a gradual increase to reflectivity of 26% at wavelength 1000 nm. Further, in Test Sample 1 having intensity 70, reflectivity increased more or less linearly following the wavelength, to about 18% at wavelength 400 nm, about 37% at wavelength 1000 nm. Furthermore, reflectivity of the film itself showed a constant value of some 11% in the entire wavelength range of 400~1000 nm.

As described above, because in functional fiber sheet relating to this invention, metallic oxides constituting its physically vapor-deposited film comprise not only ordinary oxide but also contain a small amount of lower oxide, by setting the amount of lower oxide in the amount of mixture, it is possible to maintain transparency of the vapor-deposited film so color and pattern of the fiber sheet are visible, fashionability and attributes of the fiber sheet are maintained, at the same time, functionality is provided such as electric conductivity, heat-shielding, infrared radiation blocking, ultraviolet radiation blocking, dirt repellency, anti-bacterial properties and corrosion resistance and the like, by means of the vapor-deposited film; moreover, productivity is satisfactory, and there is superior washability and peel resistance. Consequently, the aforementioned functional fiber sheet is very suitable for uses such as industrial materials, e.g. mesh screen and filter and the like, insect netting, house-wrapping material, also, outdoor tent, umbrella, indoor decorative wall panel material, ceiling material, and interior material and the like, having superior corrosion resistance and washability as well, being able to satisfy fashionability and various functionalities.

While three examples of the present invention has been shown and described, it is to be understood that many changes and modifications may be made thereunto without departing from the spirit and scope of the invention as defined in the appended claims.

What is claimed is:

1. A functional fiber sheet comprising synthetic fiber, at least one face thereof being coated with a physically vapor-deposited transparent film comprising metallic oxides, wherein said metallic oxides comprise a mixture of an ordinary oxide as a main component and a small amount of oxides having a lower valence than said ordinary oxide as a secondary component, wherein said metallic oxide is titanium oxide, its ordinary oxide being a tetravalent oxide and said lower valence oxides being divalent or trivalent oxides, and the amount of lower valence oxides to the total amount of the metallic oxides is 0.1 to 20 wt %.

2. The functional fiber sheet described in claim 1 wherein the thickness of said physically vapor-deposited film is 5 to 500 nm.

3. The functional fiber sheet as set forth in claim 1 wherein the synthetic fiber comprises synthetic fiber used in usual knit and woven use.

4. The functional fiber sheet as set forth in claim 1 wherein the synthetic fiber comprises polyester fiber, nylon fiber, acrylic fiber or polyimide fiber.

5. A method for manufacturing a functional fiber sheet comprising the steps of:
   forming a physically vapor-deposited transparent film of metallic oxides on a fiber sheet through a physical vapor deposition process;
   forming an ordinary oxide as a main component of the metallic oxides of the physically vapor-deposited transparent film by increasing the amount of oxygen to be supplied during the physical vapor deposition process; and
   forming a small amount of oxides having a lower valence than said ordinary oxide as a secondary component of the metallic oxides by lowering the amount of oxygen to be supplied to the physical vapor deposition process,
   wherein said metallic oxide is titanium oxide, its ordinary oxide being a tetravalent oxide and said lower valence oxides being divalent or trivalent oxides, and the amount of lower valence oxides to the total amount of the metallic oxides is 0.1 to 20 wt %.

* * * * *